United States Patent
Lee

(10) Patent No.: US 8,119,475 B2
(45) Date of Patent: Feb. 21, 2012

(54) METHOD OF FORMING GATE OF SEMICONDUCTOR DEVICE

(75) Inventor: Sung Hoon Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 779 days.

(21) Appl. No.: 12/163,420

(22) Filed: Jun. 27, 2008

(65) Prior Publication Data

US 2009/0111266 A1 Apr. 30, 2009

(30) Foreign Application Priority Data

Oct. 29, 2007 (KR) ........................ 10-2007-0108850

(51) Int. Cl.
*H01L 21/8238* (2006.01)
(52) U.S. Cl. ........ 438/201; 438/142; 438/264; 438/309; 438/400; 438/425; 438/698; 216/41; 216/58
(58) Field of Classification Search ................... 438/142, 438/201, 264, 309, 400, 689, 425; 216/41, 216/58
See application file for complete search history.

(56) References Cited

U.S. PATENT DOCUMENTS

| 7,595,522 B2 * | 9/2009 | Takeuchi | 257/298 |
| 2002/0063275 A1 * | 5/2002 | Chang | 257/315 |
| 2008/0220578 A1 * | 9/2008 | Lee | 438/264 |

FOREIGN PATENT DOCUMENTS

| JP | 09-180992 | 7/1997 |
| JP | 2002-075857 | 3/2002 |
| KR | 10-2001-0026120 | 4/2001 |
| KR | 10-2007-0053488 | 5/2007 |
| KR | 10-2007-0093532 | 9/2007 |
| KR | 10-0779360 | 11/2007 |
| KR | 10-2008-0008891 | 1/2008 |
| KR | 10-2008-0035916 | 4/2008 |

* cited by examiner

*Primary Examiner* — Nadine G Norton
*Assistant Examiner* — Christopher Remavege
(74) *Attorney, Agent, or Firm* — Marshall, Gerstein & Borun LLP

(57) ABSTRACT

A method of forming a gate of a semiconductor device comprising providing a semiconductor substrate over which a gate insulating layer, a first conductive layer, a dielectric layer, and a second conductive layer are sequentially formed, the semiconductor substrate defining gate line regions; removing he second conductive layer between gate line regions; removing the dielectric layer so that a top surface of the first conductive layer between the gate line regions is exposed; performing a first etch process in order to lower a height of the first conductive layer between the gate line region; removing he dielectric layer between the gate line regions; and, performing a second etch process in order to remove the first conductive layer between the gate line regions.

6 Claims, 7 Drawing Sheets

METHOD OF FORMING GATE OF SEMICONDUCTOR DEVICE

CROSS-REFERENCE TO RELATED APPLICATION

Priority to Korean patent application number 10-2007-0108850, filed on Oct. 29, 2007, the disclosure of which is incorporated by reference in its entirety, is claimed.

BACKGROUND OF THE INVENTION

The invention relates generally to a method of forming a gate of a semiconductor device and, more particularly, to a method of forming a gate of a semiconductor device, which can prevent an active region from being damaged during an etch process for gate patterning.

Active research has been conducted on NAND flash memory devices, not only because of non-volatile memory characteristics, enabling the program and erase operations, but also an advantageous structure in terms of high integration.

The NAND flash memory device has a structure in which a floating gate and a control gate are formed over a semiconductor substrate with a dielectric layer being formed therebetween and with a tunnel insulating layer formed under the floating gate.

In this NAND flash memory device, a gate corresponding to a word line or a select line is formed by stacking a gate insulating layer, a floating gate, a dielectric layer, a control gate, etc. over a semiconductor substrate and patterning the stacked layer using a gate etch process. This gate etch process is performed in-situ by changing the gate etch process according to an etch condition suitable for materials for forming each etch target layer.

BRIEF SUMMARY OF THE INVENTION

The invention is directed to a method of forming a gate of a semiconductor device, in which, when removing a dielectric layer during a gate etch process, a process of removing some of a floating gate is further performed in order to lower the height of the floating gate, and a top profile of the floating gate remaining after the dielectric layer is removed is made round, so that both sides of a tunnel insulating layer can be prevented from being excessively etched in a subsequent floating gate etch process.

According to the invention, a method of forming a gate of a semiconductor device comprises providing a semiconductor substrate over which a gate insulating layer, a first conductive layer, a dielectric layer, and a second conductive layer are sequentially formed, said semiconductor substrate defining gate line regions; removing the second conductive layer between the gate line regions; removing the dielectric layer to expose a top surface of the first conductive layer between the gate line regions; performing a first etch process in order to lower a height of the first conductive layer between the gate line regions; removing the dielectric layer between the gate line regions; and performing a second etch process in order to remove the first conductive layer between the gate line regions.

The height of the first conductive layer is preferably lowered by 10% to 50% using the first etch process. Sidewalls defined by the first conductive layer are preferably inclined. A spacer is preferably formed on sidewalls of the top surface of the first conductive layer, which remains after the first etch process, between the top surface of the first conductive layer and the dielectric layer. The top surface of the first conductive layer, which is exposed by secondarily removing the dielectric layer, preferably has a round profile. The first conductive layer exposed when removing the dielectric layer is preferably also removed.

DESCRIPTION OF SPECIFIC EMBODIMENT

A specific embodiment according to the invention is described below with reference to the accompanying drawings. However, the invention is not limited to the disclosed embodiment, but may be implemented in various ways. The embodiment is provided to complete the disclosure of the present invention and to allow those having ordinary skill in the art to understand the scope of the invention. The scope of the invention is defined by the claims.

Figure 1:
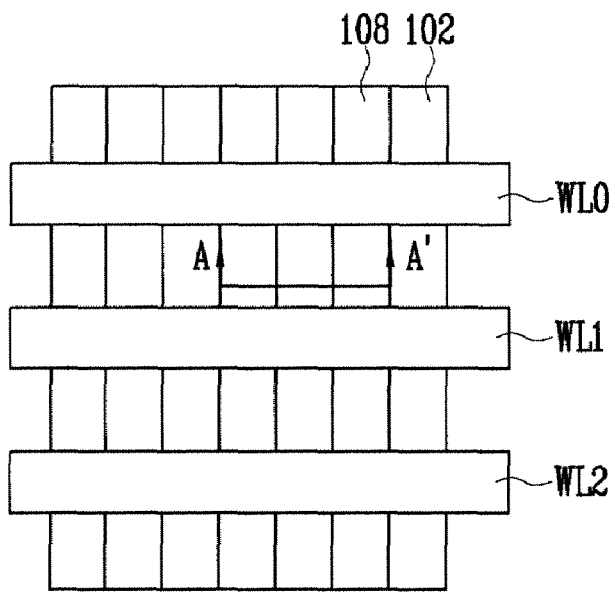
FIG. 1 is a layout diagram illustrating a method of forming a gate of a semiconductor device in accordance with the invention.

FIG. 1 is a layout diagram illustrating a method of forming a gate of a semiconductor device in accordance with the invention.

Referring to FIG. 1, a plurality of isolation regions 108 and a plurality of active regions 102 are alternately formed in a semiconductor substrate. Gate lines, such as a plurality of word lines WL0, WL1, WL2, . . . , a source select line SSL (not shown), and a drain select line DSL, (not shown), are formed to cross the isolation region 108 and the active region 102. Memory cells are formed at the intersections of the active regions 102 and the word lines WL0, WL1, WL2, . . . . Source select transistors (not shown) are formed at the intersections of the active regions 102 and the source select line SSL (not shown). Drain select transistors (not shown) are formed at the intersections of the active regions 102 and the drain select line (not shown).

Of these, the plurality of word lines WL0, WL1, WL2, . . . are formed of a stacked gate in which a floating gate, a dielectric layer, a control gate, etc. are stacked. This is described in detail below.

FIGS. 2A to 2H are cross-sectional views of the semiconductor device taken along line A-A' of FIG. 1 in order to describe a method of forming a gate of a semiconductor device in accordance with the invention. That is, A-A' of FIG. 1 is a space between the word lines and is a region from which a plurality of the stacked layers formed over the semiconductor substrate are sequentially removed when a gate patterning process is performed in order to form the gate lines such as the word lines.

Figure 2A:
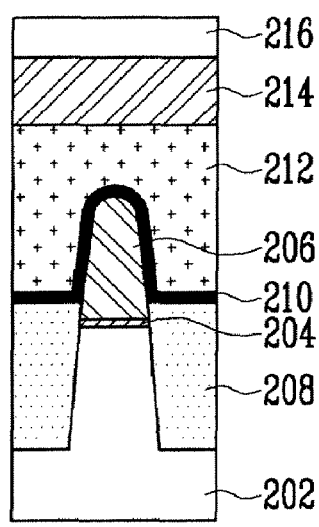
FIGS. 2A to 2H are cross-sectional views of the semiconductor device taken along line A-A' of FIG. 1 in order to describe a method of forming a gate of a semiconductor device in accordance with the invention.

Referring to FIG. 2A, a screen oxide layer (not shown) is formed on a semiconductor substrate 202. A well ion implantation process and a threshold voltage ion implantation process are performed on the semiconductor substrate 202. The screen oxide layer (not shown) functions to prevent the interface of the semiconductor substrate 202 from being damaged during the well ion implantation process or the threshold voltage ion implantation process. Thus, a well region (not shown) is formed in the semiconductor substrate 202 and the well region can have a triple structure.

After the screen oxide layer (not shown) is removed, a tunnel insulating layer 204 and a first conductive layer 206 for a floating gate are sequentially formed over the semiconductor substrate 202. The tunnel insulating layer 204 is formed on the active region of the semiconductor substrate 202 and is preferably formed of an oxide layer. The first conductive layer 206 is preferably formed from polysilicon.

At this time, to ensure a proper coupling ratio of a miniaturized and highly-integrated semiconductor device when fabricating the semiconductor device using a micro process having a line width of 60 nm or less, an area where the floating gate brings in contact with the control gate must be increased. To this end, it is preferred that the height of the floating gate is gradually increased. In order to increase the height of the floating gate, it is preferred that the height of the first conductive layer 206 be increased when compared with the prior art.

Next, the first conductive layer 206 and the gate insulating layer 204 are patterned by an etch process employing a hard mask pattern (not shown) formed on the first conductive layer 206. The isolation region of the semiconductor substrate 202 is etched to thereby form trenches in the semiconductor substrate 202. At this time, the trench is inclined and, therefore, the sidewalls of the first conductive layer 206 are also inclined. Insulating material, such as an oxide layer, is formed on the entire surface including the trenches, thus gap-filling the trenches. A polishing process, such as a chemical mechanical polishing (CMP) method, is performed on the insulating material in order to form isolation layers 208. A pad nitride layer (not shown) is then removed. Next, in order to increase the contact area of the floating gate and the control gate, a process of lowering the height of the isolation layer 208 can also be performed.

A dielectric layer 210, a second conductive layer 212 for a control gate, a gate electrode layer 214, and a hard mask layer 216 are formed over the entire surface including the first conductive layer 206 and the isolation layer 208. The dielectric layer 210 preferably has a stacked layer of oxide/nitride/oxide (ONO) structure and can have a thickness, which can maintain a step by the first conductive layer 206. The second conductive layer 212 is preferably formed of polysilicon. The gate electrode layer 214 is preferably formed from tungsten silicide with low resistance.

Figure 2B:
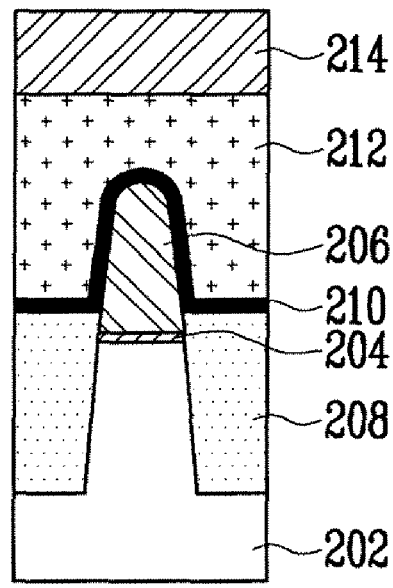

Referring to FIG. 2B, in order to perform gate patterning, the stacked layers formed between regions in which the gate lines will be formed are removed. To this end, first, the hard mask layer (refer to 216 of FIG. 2A) formed between the regions in which the gate lines will be formed is removed, thus forming hard mask patterns (not shown). That is, the hard mask layer (refer to 216 of FIG. 2A) remains only on the gate electrode layer 214 of the regions in which the gate lines such as the word lines are formed.

Figure 2C:
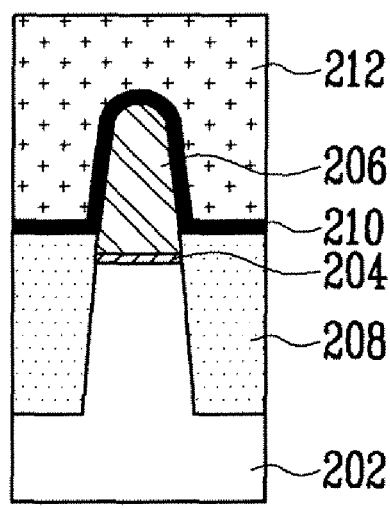

Referring to FIG. 2C, the gate electrode layer (refer to 214 of FIG. 2B) formed between the regions in which the gate lines will be formed is removed by an etch process employing the hard mask patterns (not shown).

FIGS. 3A to 3E are SEM photographs of respective process steps in order to describe the method of forming the gate of the semiconductor device in accordance with the invention.

Figure 2D:
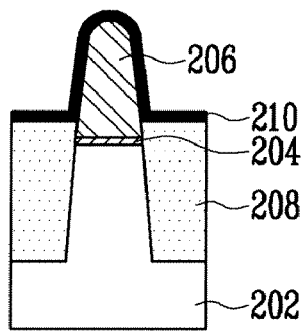
Figure 3A:
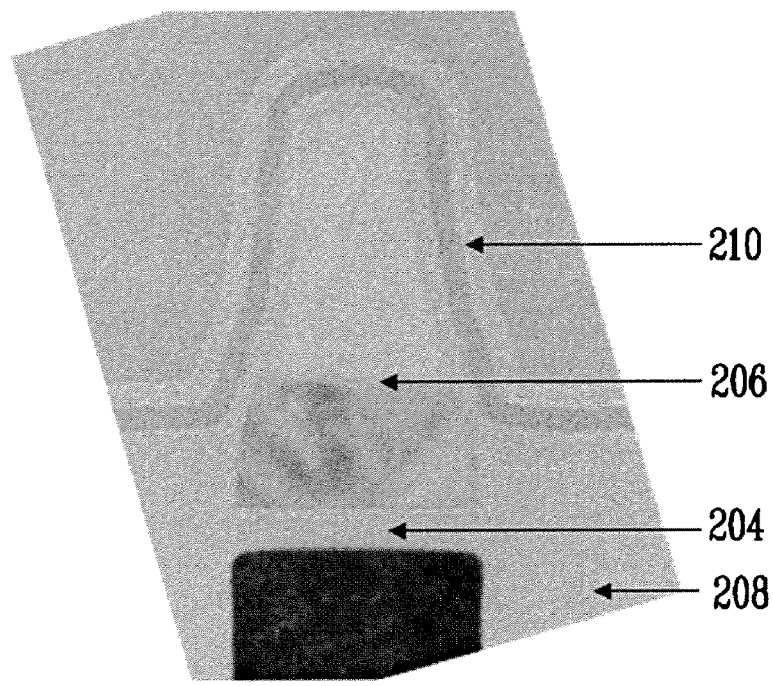
FIGS. 3A to 3E are scanning electron microscope (SEM) photographs of respective process steps in order to describe a method of forming a gate of a semiconductor device in accordance with the invention.

Referring to FIGS. 2D and 3A, the second conductive layer (refer to 212 of FIG. 2C) formed between the regions in which the gate lines will be formed is removed.

Figure 2E:
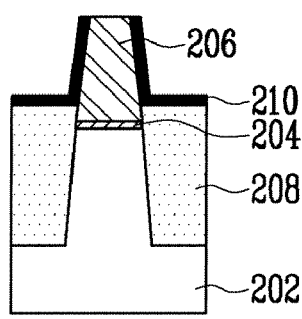
Figure 3B:
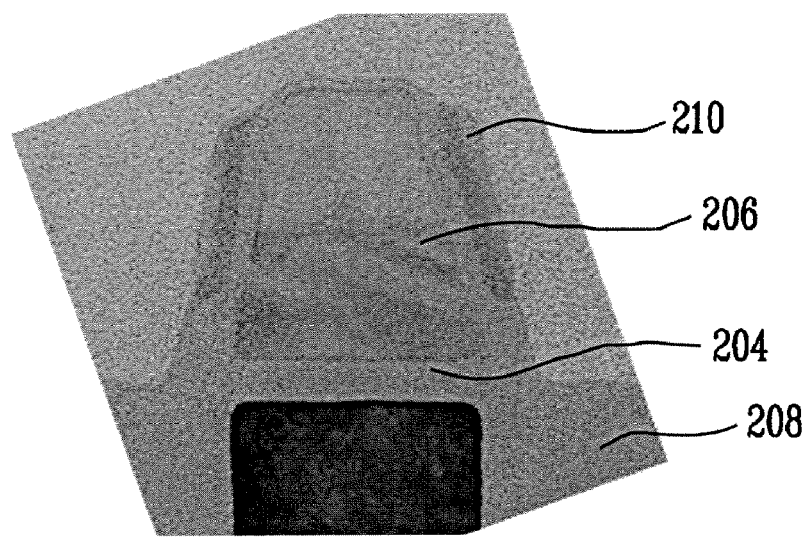

Referring to FIGS. 2E and 3B, some of the dielectric layer 210 formed on the first conductive layer 206 formed between the regions in which the gate lines will be formed is removed, so that a top surface of the first conductive layer 206 formed between the regions in which the gate lines will be formed is exposed. Meanwhile, the first conductive layer 206 exposed by the etch process for removing the dielectric layer 210 can also be partially removed.

Figure 2F:
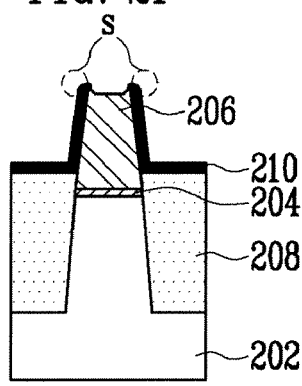
Figure 3C:
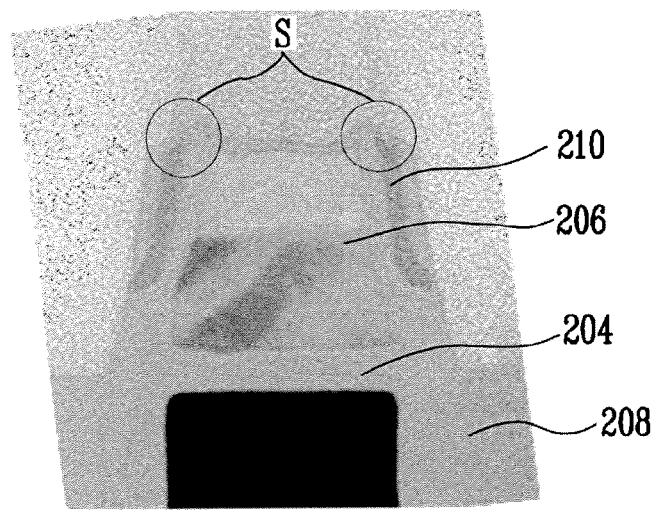

Referring to FIGS. 2F and 3C, a first etch process of lowering the height of the first conductive layer 206 by partially removing the first conductive layer 206 exposed by the above process is performed. In this case, the removed height of the first conductive layer 206 can have an etch target, which is preferably 10% to 50% of the height of the first conductive layer 206 before etching. Here, since the lateral walls of the first conductive layer 206 are inclined, a spacer is formed on the sidewalls 's' at the top of the first conductive layer 206 contacting the inside of the dielectric layer 210. Thus, the height of the sidewalls 's' at the top of the first conductive layer 206, of the top of the first conductive layer 206, can be formed high.

Figure 2G:
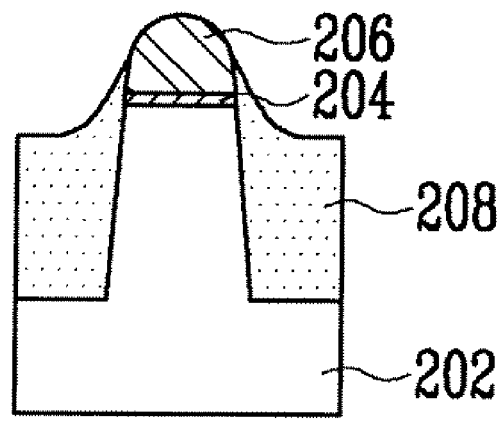
Figure 3D:
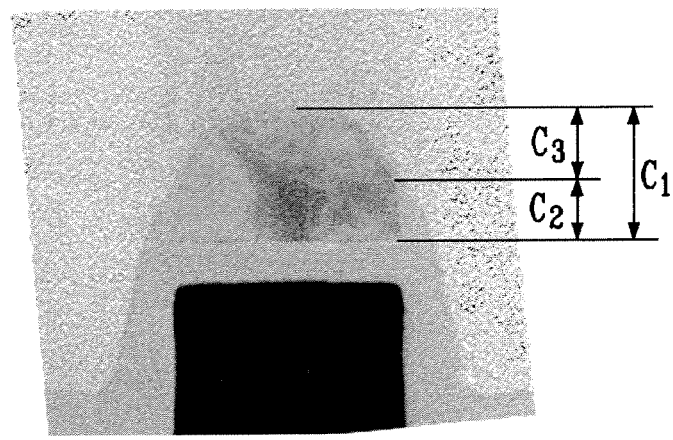

Referring to FIGS. 2G and 3D, the dielectric layer (refer to 210 of FIG. 2F) formed between the regions in which the gate lines will be formed is removed. Here, the top of the first conductive layer 206 is partially removed. In particular, there occurs a difference in the etching degree between central and peripheral portions of the first conductive layer 206, so that a height C1 (see FIG. 3D) of the central portion of the first conductive layer 206 may remain higher than a height C2 of the peripheral portion of the first conductive layer 206. However, an overall height of the first conductive layer 206, that is, a target etch layer has lowered by the above process and the height of the sidewalls 's' (refer to FIG. 2F) at the top of the first conductive layer 206 has increased. Accordingly, a difference C3 in the height between the central and peripheral portions of the first conductive layer 206, which remains a corresponding process, can be minimized.

Meanwhile, in this process, some of the isolation layer 208 can also be removed.

Figure 2H:
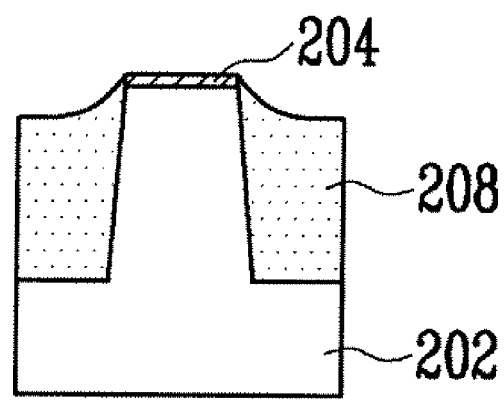
Figure 3E:
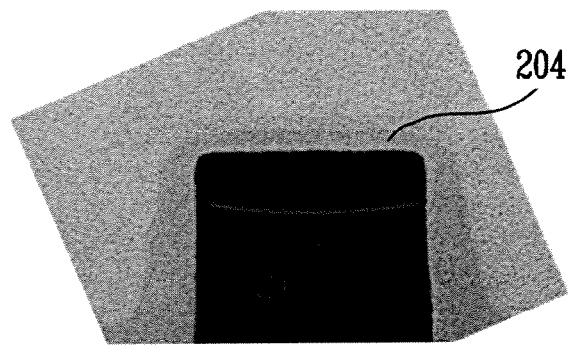

Referring to FIGS. 2H and 3E, a second etch process of removing the first conductive layer (refer to 206 of FIG. 2G) is performed. Here, the tunnel insulating layer 204, which is exposed in the process of removing the first conductive layer (refer to 206 of FIG. 2G), can also be removed. However, since the difference in the height between the central and peripheral portions of the first conductive layer (refer to 206 of FIG. 2G), which remains in the previous process, can be minimized, a problem that some of the tunnel insulating layer 204 is first exposed when removing the first conductive layer (refer to 206 of FIG. 2G) can be solved. Accordingly, a problem in that the thickness of the tunnel insulating layer 204, which remains, becomes excessively thin due to the continuous exposure of some of the tunnel insulating layer 204 until the first conductive layer 206 (refer to FIG. 2G) is fully removed, becomes thin can be solved.

Figure 4A:
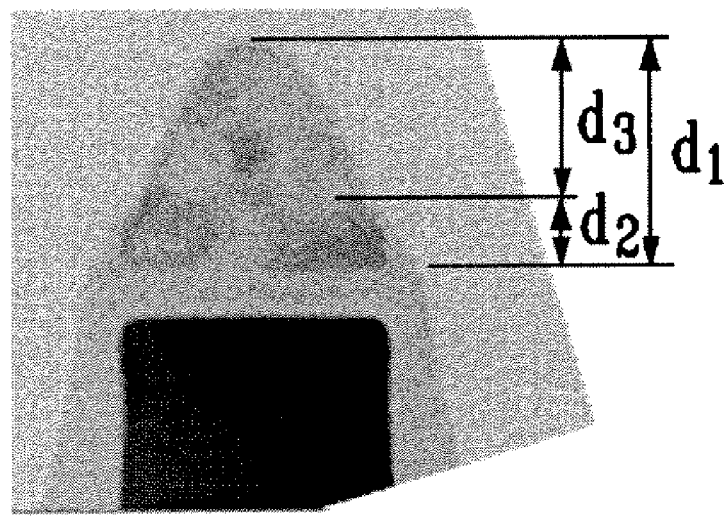
FIGS. 4A and 4B are sectional views of semiconductor devices on which a conventional gate patterning process has been performed.
Figure 4B:
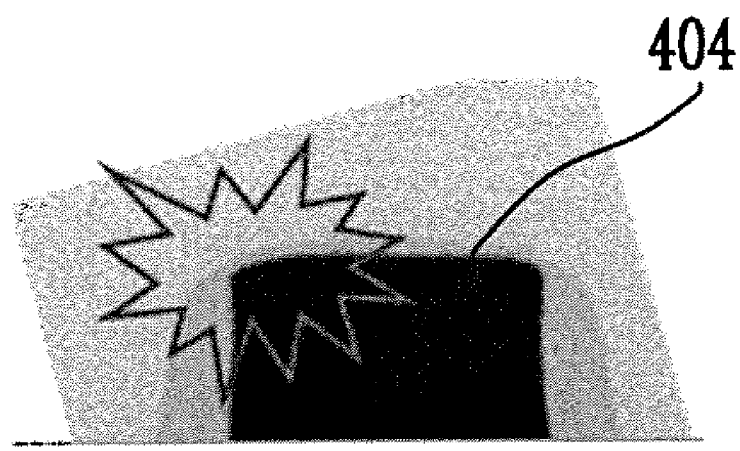

FIGS. 4A and 4B are sectional views of semiconductor devices on which a conventional gate patterning process has been performed.

As the size of a semiconductor device is gradually miniaturized and the line width decreases, it has become important to ensure a proper coupling ratio of a floating gate and a control gate. Thus, technologies for increasing the contact area of the floating gate and the control gate by increasing the height of the floating gate have emerged. However, in this case, a height d1 (see FIG. 4A) of the central portion of the first conductive layer 406, which remains after the process of etching the dielectric layer, can be excessively higher than a height d2 of the peripheral portion of the first conductive layer 406. Accordingly, a difference d3 in the height between the central and peripheral portions of the first conductive layer 406, which remains after a corresponding process, can be excessively great.

If an etch process is performed on the first conductive layer (refer to 406 of FIG. 4A), the central portion of the first conductive layer (refer to 406 of FIG. 4A) is etched faster than the peripheral portion of the first conductive layer, so that the time for the tunnel insulating layer 404, formed at the peripheral portions of the first conductive layer (refer to 406 of FIG. 4A), to be exposed during the etch process, is increased that much. Thus, the peripheral portions of the tunnel insulating layer 404 is etched excessively. Consequently, the peripheral portions of the tunnel insulating layer 404 can become thinner than a proper thickness or be removed.

In particular, this problem may become a more serious issue as the aspect ratio increases due to an increased height of the floating gate when fabricating a semiconductor device using the manufacturing process of 60 nm or less.

If the thickness of the tunnel insulating layer 404 is excessively thin as described above, a problem may arise because an ion implantation region is formed excessively deep at the time of an ion implantation process when drain/source regions are subsequently formed. Further, it may also have an adverse effect on the performance of the device since the thickness of the tunnel insulating layer 204 exposed on the semiconductor substrate 202 is irregular.

However, in the invention, a process of lowering the height of the first conductive layer is performed additionally during the etch process of the dielectric layer, so that a height difference between the central and peripheral portions of the first conductive layer remaining after the etch process of the dielectric layer can be minimized. Accordingly, damage to the tunnel insulating layer, which is exposed at the bottom when removing the first conductive layer, can be minimized.

According to the method of forming the gate of the semiconductor device in accordance with the invention, a problem in that the thickness on both sides of the tunnel insulating layer formed between the gate lines becomes excessively thin can be solved. Accordingly, since the tunnel insulating layer having an entirely uniform thickness can be formed, attack against the active region can be prevented and the ion implantation region having a proper depth on both sides of the gate can be formed. Accordingly, semiconductor devices with more reliability and high performance can be fabricated.

The embodiment disclosed herein has been proposed to allow a person skilled in the art to easily implement the invention, and the person skilled in the part may implement the invention in various ways. Therefore, the scope of the invention is not limited by or to the embodiment as described above, and should be construed to be defined only by the appended claims and their equivalents.

What is claimed is:

1. A method of forming a gate of a semiconductor device, the method comprising:
    providing a semiconductor substrate over which a gate insulating layer, a first conductive layer, a dielectric layer, and a second conductive layer are sequentially formed, said semiconductor substrate defining gate line regions;
    removing the second conductive layer between the gate line regions;
    firstly removing the dielectric layer to expose a top surface of the first conductive layer between the gate line regions;
    performing a first etch process in order to lower a height of the first conductive layer between the gate line regions;
    secondarily removing the dielectric layer between the gate line regions; and
    performing a second etch process in order to remove the first conductive layer between the gate line regions.

2. The method of claim 1, comprising lowering the height of the first conductive layer by 10% to 50% using the first etch process.

3. The method of claim 1, wherein the first conductive layer defines inclined sidewalls.

4. The method of claim 1, wherein the top surface of the first conductive layer defines sidewalls contacting an inside surface of the dielectric layer, the method comprising forming a spacer between the sidewalls of the top surface of the first conductive layer remaining after the first etch process, at the top surface of the first conductive layer contacting the inside surface of the dielectric layer.

5. The method of claim 1, wherein the top surface of the first conductive layer, which is exposed by secondarily removing the dielectric layer, has a round profile.

6. The method of claim 1, comprising removing the first conductive layer exposed when secondarily removing the dielectric layer.

* * * * *